US 8,096,641 B2

(12) United States Patent
Yamada

(10) Patent No.: US 8,096,641 B2
(45) Date of Patent: Jan. 17, 2012

(54) FLEXIBLE PRINTED CIRCUIT BOARD AND LIQUID DISCHARGE HEAD INCLUDING THE SAME

(75) Inventor: Hiroshi Yamada, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 315 days.

(21) Appl. No.: 12/606,935

(22) Filed: Oct. 27, 2009

(65) Prior Publication Data

US 2010/0103223 A1    Apr. 29, 2010

(30) Foreign Application Priority Data

Oct. 28, 2008  (JP) ................. 2008-276983

(51) Int. Cl.
*B41J 2/14* (2006.01)
*B41J 2/16* (2006.01)
(52) U.S. Cl. .......................... 347/50; 347/58
(58) Field of Classification Search .............. 347/5, 9, 347/12, 40, 50, 58–59, 85–86
See application file for complete search history.

(56) References Cited

U.S. PATENT DOCUMENTS

| 4,878,070 A * | 10/1989 | Watrobski .............. 347/58 |
| 5,610,642 A * | 3/1997 | Nobel et al. ............. 347/50 |
| 6,604,815 B2 * | 8/2003 | Chen et al. ............... 347/50 |
| 2006/0238558 A1 | 10/2006 | Hatasa et al. | |

FOREIGN PATENT DOCUMENTS

| JP | 2004-050636 | 2/2004 |
| JP | 2006-297826 | 11/2006 |
| JP | 2006-344638 | 12/2006 |

* cited by examiner

*Primary Examiner* — Thinh Nguyen
(74) *Attorney, Agent, or Firm* — Canon USA Inc IP Division

(57) ABSTRACT

A flexible printed circuit board, included in a liquid discharge head, includes a film having a length in the longitudinal direction, a plurality of connection terminals arranged in a first area of the film adjacent to one side of the film in the longitudinal direction, a contact portion disposed in a second area of the film adjacent to the other side thereof in the longitudinal direction, the contact portion including a plurality of contact pads, and a plurality of wiring lines arranged in the film. The length of the second area of the film in a direction orthogonal to the longitudinal direction is more than two times the length of the first area thereof in that direction. The planar shape of the film is L-shaped.

13 Claims, 5 Drawing Sheets

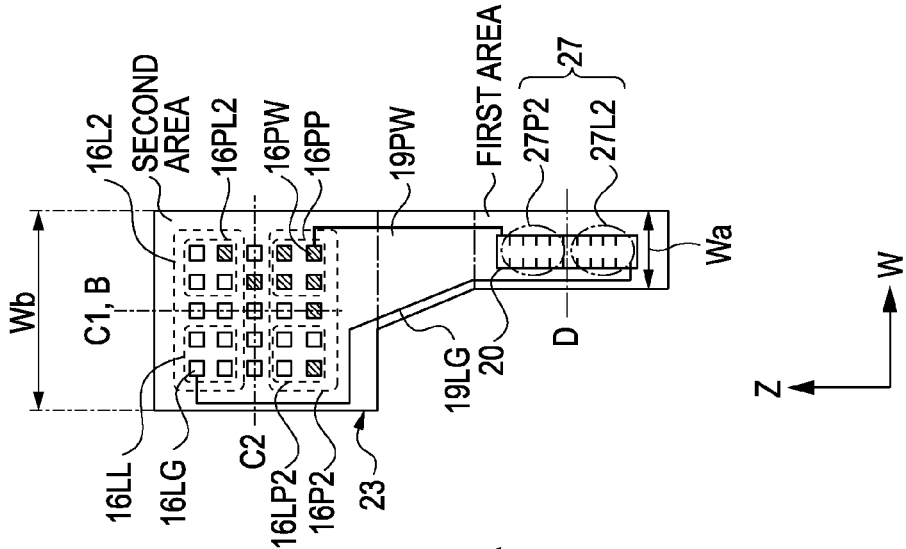
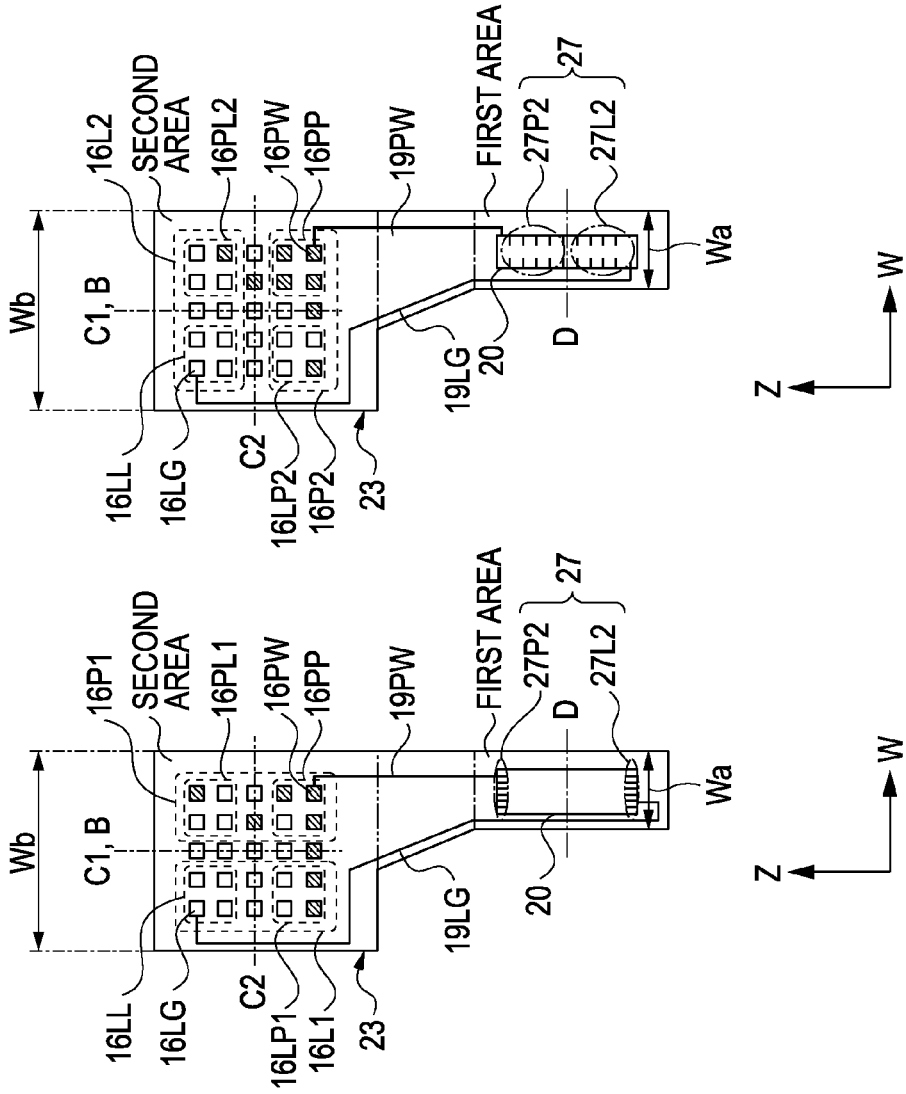

FLEXIBLE PRINTED CIRCUIT BOARD AND LIQUID DISCHARGE HEAD INCLUDING THE SAME

BACKGROUND OF THE INVENTION

1. Field of the Invention

The present invention relates to a liquid discharge head that discharges liquid, such as ink, to perform recording and a flexible printed circuit board available for the liquid discharge head.

2. Description of the Related Art

An inkjet recording head (hereinafter, referred to as a "recording head") is known as a liquid discharge head.

As for the generally known structure of such a recording head, the recording head includes a recording element substrate that includes an array of discharge ports (hereinafter, referred to as a "discharge port array") through which ink is discharged and energy generating elements, arranged so as to correspond to the respective discharge ports, for discharging the ink.

The recording head includes a contact portion electrically connected to the main body of an inkjet recording apparatus in order to receive an electrical signal and electric power used for driving the energy generating elements from the main body of the apparatus. FIGS. 4A and 4B each illustrate an example of the known structure of a recording head 101 in which a recording element substrate 102 is disposed on the bottom surface of the recording head 101 and a contact portion 106 including a plurality of contact pads is disposed on one side surface substantially perpendicular to the bottom surface. Japanese Patent Laid-Open Nos. 2006-297826 and 2004-050636 each disclose a recording head having such a structure.

The use of an electrical printed circuit board having flexibility, namely, a flexible printed circuit board 103 is effective for electrical connection between the contact portion 106 and the recording element substrate 102 which are disposed on the different surfaces of the housing of the recording head 101.

As disclosed in Japanese Patent Laid-Open No. 2006-344638, the flexible printed circuit board is typically manufactured such that the flexible printed circuit board is stamped out from a base material or is cut out from the base material with a slicer or a laser.

A reduction in area of the above-described flexible printed circuit board in order to increase the number of flexible printed circuit boards cut out from the base material is effective in reducing the manufacturing cost of the recording head.

The structure of FIG. 4B in which the recording element substrate 102 is connected to one end of the flexible printed circuit board 103 is more preferable than the structure of FIG. 4A in which the recording element substrate 102 is disposed in an opening of the flexible printed circuit board 103 so that the recording element substrate 102 is electrically connected to the flexible printed circuit board 103. Because the length of the flexible printed circuit board 103 can be shortened. Accordingly, the area of the flexible printed circuit board 103 can be reduced by an amount corresponding to the reduction in length of the flexible printed circuit board 103.

Even when the area of the flexible printed circuit board 103 is reduced, however, a wasted portion is provided, as shown in FIG. 4B, upon manufacturing the flexible printed circuit board. Disadvantageously, it is difficult to reduce the manufacturing cost of the flexible printed circuit board. Unfortunately, it is difficult to cut down the manufacturing cost of the recording head.

SUMMARY OF THE INVENTION

The present invention provides a liquid discharge head including a flexible printed circuit board having a shape optimized so that the number of flexible printed circuit boards cut out from a base material is increased as much as possible.

An aspect of the present invention provides a flexible printed circuit board included in a liquid discharge head including a liquid discharge substrate for discharging liquid. The flexible printed circuit board includes a film whose length in the longitudinal direction is greater than the length in a direction orthogonal to the longitudinal direction, a plurality of connection terminals, arranged in a first area of the film adjacent to one side of the film in the longitudinal direction, for electrical connection to the liquid discharge substrate, a contact portion disposed in a second area of the film adjacent to the other side thereof in the longitudinal direction, the contact portion including a plurality of contact pads for electrical connection to the outside, and a plurality of wiring lines, arranged in the film, for electrical connection between the connection terminals and the contact pads. The length of the second area of the film in the direction orthogonal to the longitudinal direction is more than two times the length of the first area of the film in that direction. The planar shape of the film is L-shaped.

The present invention allows for a reduction in manufacturing cost of the flexible printed circuit board. Accordingly, the application of the flexible printed circuit board according to the aspect of the present invention to a liquid discharge head allows for a reduction in manufacturing cost of the liquid discharge head.

Further features of the present invention will become apparent from the following description of exemplary embodiments with reference to the attached drawings.

BRIEF DESCRIPTION OF THE DRAWINGS

FIGS. 2A to 2C are diagrams explaining a second embodiment of the present invention.

DESCRIPTION OF THE EMBODIMENTS

Embodiments of the present invention will be described below with reference to the drawings.

A first embodiment will now be described.

An inkjet recording head (hereinafter, referred to as a "recording head") for discharging liquid, such as ink, will be described as a liquid discharge head which will be described below.

Figure 1A:
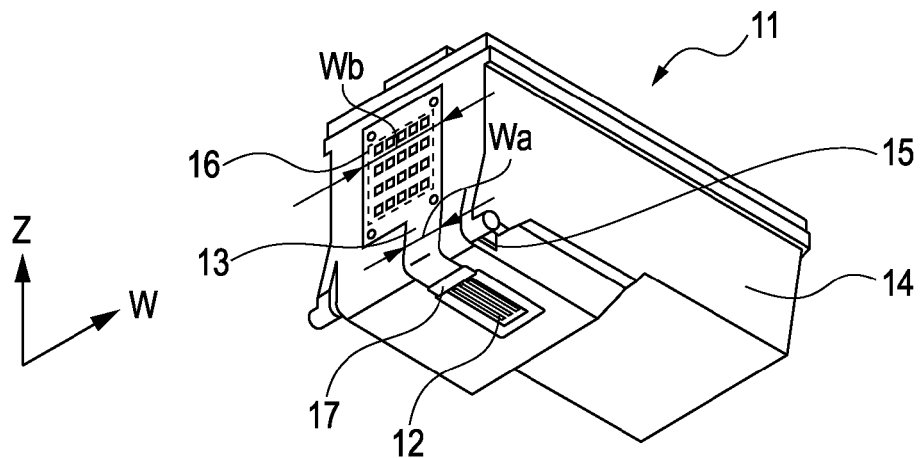
FIGS. 1A and 1B are diagrams explaining a first embodiment of the present invention.

Referring to FIG. 1A, a recording head 11 mainly includes a recording element substrate 12 which serves as a liquid discharge substrate, an electrical wiring tape 13 which functions as a flexible print circuit board, an ink tank 14, and positioning portions 15.

The ink tank 14 receives predetermined ink. The ink is guided through an ink supply channel provided in the ink tank 14 to the recording element substrate 12 disposed in the housing of the ink tank 14. The ink is discharged from discharge ports arranged in the recording element substrate 12.

In this embodiment, it is assumed that the recording head is integrated with the ink tank. The ink tank may be detachable from the recording head.

For attachment of the recording head to a main body of a recording apparatus (hereinafter, referred to as a "printer"), it is preferable to position the recording head 11 with reference to the recording element substrate 12 in order to provide high-quality recording, since the ink is discharged from the discharge ports arranged in the recording element substrate 12 to perform recording. Accordingly, the positioning portions 15 used for positioning the recording head 11 upon attaching the head to the main body of the printer (hereinafter, referred to as a "printer main body") are positioned in the vicinity of the recording element substrate 12 in the recording head 11.

The recording element substrate 12 includes an ink supply port that includes a long grooved through-hole communicating with the ink supply channel provided in the ink tank 14. Electrothermal transducers (heaters), serving as energy generating elements, for discharging the ink are provided on both sides of the ink supply port.

In addition, the recording element substrate 12 includes discharge ports corresponding to the respective heaters and wiring lines for supplying electric power and electrical signals to the heaters. The recording element substrate 12 further includes electrode portions for receiving electrical signals and electric power from the outside of the recording element substrate 12 (in this case, the electrical wiring tape 13) such that the electrode portions are arranged in one end of the recording element substrate 12.

The electrical wiring tape 13 has flexibility and includes a contact portion 16, a connection terminal portion 17, and electrical wiring lines 19 (refer to FIGS. 2B and 2C) so that those components are used to transmit an electrical signal and electrical power for ink discharge from the printer main body to the recording element substrate 12. One of the examples of the flexible electrical wiring tape is a tape automated bonding (TAB) tape.

The contact portion 16 includes a plurality of contact pads. When the recording head is attached to the printer main body, the contact portion 16 is come into contact with connector pins (not shown) in the printer main body to establish electrical connection therebetween.

The connection terminal portion 17 includes a plurality of lead terminals which are electrically connected to the electrode portions arranged in the end of the recording element substrate 12.

The electrical wiring lines 19 connect the contact pads constituting the contact portion 16 to the lead terminals constituting the connection terminal portion 17.

The electrical wiring tape 13 is manufactured as follows. A wiring pattern is formed in a sheet film 18. Segments, each having a predetermined shape, to be electrical wiring tapes 13 are cut out from the sheet film 18 using a cutting die, thus providing many electrical wiring tapes 13.

After the connection terminal portion 17 is connected to the electrode portions of the recording element substrate 12, a seal is applied to the connection terminal portion 17 so as to protect the connected portion against liquid such as ink.

With this arrangement, when the recording head 11 is attached to the printer main body, the contact portion 16 is come into contact with the connector pints in the printer main body, so that electrical signals and electric power can be transmitted from the printer main body to the recording element substrate 12.

The electrical signals supplied from the printer main body are transmitted through the electrical wiring lines 19 connected to the contact pads arranged in the contact portion 16 to the connection terminal portion 17 disposed in the end of the electrical wiring tape 13. Voltages are applied to the heaters arranged in the recording element substrate 12 on the basis of the electrical signals, so that ink droplets are discharged from the discharge ports.

Features of this embodiment will now be concretely described.

Figure 1B:
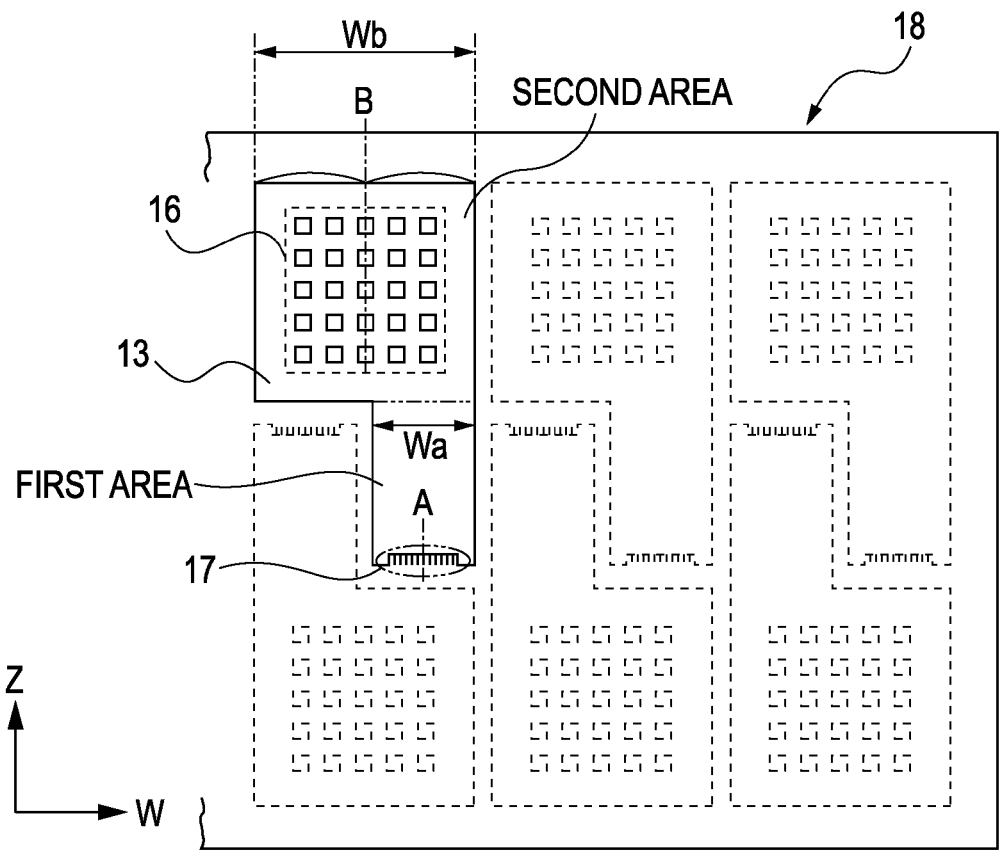

The electrical wiring tape 13 will now be described with reference to FIG. 1B. FIG. 1B illustrates the arrangement of electrical wiring tapes, among which the electrical wiring tape 13 is to be cut out from the sheet film 18.

Referring to FIG. 1B, the electrical wiring tape 13 includes a film segment (or film) which has a length in the longitudinal direction in the vertical direction in the drawing sheet of FIG. 1B and in which the length in the longitudinal direction is greater than the length in a direction orthogonal to the longitudinal direction. The electrical wiring tape 13 has a first area having a predetermined width Wa on one side thereof in the longitudinal direction. In the first area, the connection terminal portion 17 is provided. The electrical wiring tape 13 has a second area on the other side thereof in the longitudinal direction, the second area having a predetermined width Wb greater than the width Wa. In the second area, the contact portion 16 is provided. The width direction of each of the first and second areas is indicated by W in FIGS. 1A and 1B. The direction W is substantially perpendicular to the direction Z.

The center line of the first area in the width direction W is indicated by A and that of the second area in the width direction W is indicated by B. In the electrical wiring tape 13, the first area is positioned so as not to project from the second area in the width direction W. In addition, one end of the first area in the width direction W and one end of the second area in that direction are substantially in line with each other. Furthermore, the width Wb is more than two times the width Wa. In other words, as shown in FIG. 1B, the electrical wiring tape 13 is designed such that the first and second areas are arranged in the direction intersecting the width direction W and the planar shape of the electrical wiring tape 13 is substantially L-shaped before bending.

When each electrical wiring tape is formed into such an L-shape and the L-shaped tapes are arranged as shown in FIG. 1B, a wasted portion left in the sheet film 18 upon manufacturing the electrical wiring tapes can be reduced. Advantageously, the number of electrical wiring tapes to be cut out can be increased. Thus, the manufacturing cost of the electrical wiring tape 13 can be reduced.

Since the first area, whose width is less than that of the second area, of the electrical wiring tape 13 is bent along the recording head, as shown in FIG. 1A, a force required to bend the first area of the electrical wiring tape 13 can be smaller than that required to bend the second area thereof. Because the stiffness of the first area having a narrow width is smaller than that of the second area having a wide width.

It is preferable that the width Wa approximate to half the width Wb as much as possible. Specifically, it is preferable that the width Wa be increased as much as possible, since it is advantageous in increasing the flexibility of arranging the electrical wiring lines 19 and preventing an increase in electric resistance of the electrical wiring lines 19.

Figure 5:
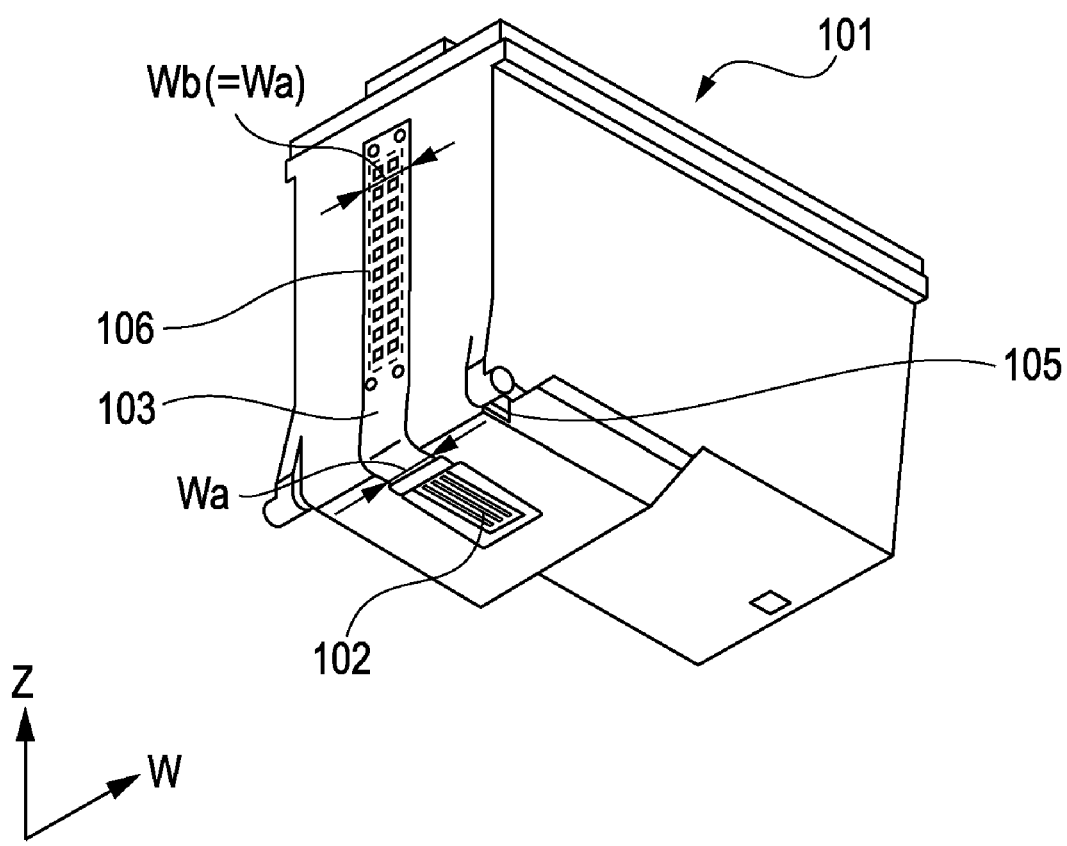
FIG. 5 is a diagram explaining a recording head according to a comparative example of the present invention.

From the viewpoint of reducing a wasted portion left in the film 18, the electrical wiring tape may have a predetermined width matching the width Wa of the first area, as shown in FIG. 5.

Referring to FIG. 5, in an electrical wiring tape 103 having such a predetermined width matching the width Wa of the first area, the width of a contact portion 106 in the direction W is narrow and the length thereof in the direction Z is long so as to conform to the shape of the electrical wiring tape.

Accordingly, some of the contact pads constituting the contact portion 106 are arranged far from positioning portions 105 used for positioning a recording head 101 relative to the printer main body.

As the position of the contact pad is farther from the positioning portions 105, its accuracy of position is lowered upon attaching the recording head 101 to the printer main body. Unfortunately, there is a possibility that electrical connection between the recording head 101 and the printer main body is not ensured.

According to the present embodiment, therefore, the width Wb is greater than the width Wa as described above so that the contact portion 16 is disposed near the positioning portions 15, thus resulting in an increase in reliability of the electrical connection between the recording head 11 and the printer main body.

Assuming that the contact pads arranged in the elongated electrical wiring tape (FIG. 5) are equal in number to those in the L-shaped electrical wiring tape (FIG. 1A), the area having the width Wb of the L-shaped electrical wiring tape 13 can be reduced in dimension in the direction Z.

Accordingly, when the recording head is minimized in the direction Z, the contact pads can be appropriately arranged in the recording head, since the width Wb is greater than the width Wa as described in the present embodiment.

In the present embodiment, the width Wa is substantially the same as the width of the recording element substrate 12, and the electrical wiring tape 13 is electrically connected to the one end in the longitudinal direction of the substantially rectangular recording element substrate 12. With this arrangement, it is preferable, since it is unnecessary to arrange the electrical wiring lines 19 such that the lines are connected to the other end in the longitudinal direction of the recording element substrate 12.

With the above-described arrangement in the present embodiment, a wasted portion left in the film upon manufacturing the electrical wiring tapes can be reduced, resulting in an increase in the number of electrical wiring tapes to be cut out from the film. Thus, the recording head can be provided with a reduced manufacturing cost.

A second embodiment of the present invention will be described below. FIG. 2A illustrates a recording head 21 according to the present embodiment. FIG. 2B illustrates an electrical wiring tape 23 in the present embodiment. The entire structure of the recording head 21 is the same as that according to the first embodiment. Detailed explanation of components designated by the same reference numerals as those in the first embodiment is omitted.

The width Wa of a first area, in which connection terminal portions 27 are arranged, of the electrical wiring tape 23 is less than the width Wb of a second area in which a contact portion 16 is disposed, as in the case of the first embodiment.

In the present embodiment, the electrical wiring tape 23 has an opening 20 for attachment of a recording element substrate 12. The connection terminal portions 27 each including a plurality of lead terminals are arranged in the periphery of the opening 20 so as to be electrically connected to electrode portions disposed in ends of the recording element substrate 12.

A feature of the second embodiment is the arrangement, as shown in FIG. 2B or 2C, of power supply contact pads among contact pads constituting the contact portion 16.

To drive each heater provided in the recording element substrate 12, a logic signal which serves as an electrical signal supplied to a corresponding driving circuit for controlling the driving of the heater, electric power for the driving circuit, and electric power for driving the heater have to be transmitted to the recording element substrate 12. When the driving circuit is provided with, for example, a MOS transistor that serves as a switching element for controlling the turn on/off of the heater, electric power for driving the switching element is also transmitted to the recording element substrate 12.

In the present embodiment, a logic signal is approximately 3.3 V and electric power for the driving circuit is approximately 3.3 V which is equivalent to the voltage of the logic signal. Electric power for driving the heater and that for driving the switching element are each approximately 24 V.

Accordingly, the electrical wiring lines 19 of the electrical wiring tape 23 include a first wiring line and a second wiring line. The first wiring line is a power supply wiring line 19PW for transmitting electric power for the driving circuit and electric power for driving the heater and the switching element. The second wiring line is a logic wiring line 19LG for transmitting a logic signal.

As for the logic wiring line 19LG for transmitting a logic signal, a relatively small current flows through the logic wiring line 19LG. Accordingly, a thin wiring line having a width of approximately 35 μm is used as the logic wiring line 19LG. As the power supply wiring line 19PW, a wiring line having a width greater than that of the logic wiring line 19LG, namely, a width of approximately 0.1 mm to approximately 4 mm is used in order to prevent a voltage drop due to wiring resistance. Specifically, the logic wiring line 19LG functions as an input/output line for transmitting an electrical signal at a low voltage of approximately 3.3 V. The power supply wiring line 19PW functions as a power supply line and a grounding line through which current supplied from the power supply line is fed back.

The electrical wiring lines 19 illustrated in FIGS. 2B and 2C are simplified. In actual, the electrical wiring lines 19 electrically connecting the respective contact pads to the corresponding lead terminals are arranged.

The arrangement of the power supply contact pads related to the feature of the present embodiment will be described in detail below.

Referring to FIGS. 2B and 2C, the center line (first center line) of the contact portion 16 in the direction W is indicated by C1 and the center line (second center line) thereof in the direction Z is indicated by C2. In the present embodiment, the center line C1 substantially matches the center line B of the second area, where the contact portion 16 is positioned, of the electrical wiring tape 23. With this arrangement, the contact portion 16 can be efficiently positioned relative to the electrical wiring tape 23. The center line C1 may be shifted from the center line B.

In FIG. 2B, 16P1 denotes a region of the contact portion 16 adjacent to the first area in the direction W with reference to the center line C1 and 16L1 denotes a region thereof remote from the first area. In addition, 16PP denotes a region of the contact portion 16 adjacent to the first area in the direction Z with reference to the center line C2 and 16PL1 denotes a region thereof remote from the first area.

Furthermore, 16LG denotes a contact pad connected to the logic wiring line 19LG among the contact pads and 16PW denotes a power supply contact pad connected to the power supply wiring line 19PW.

In the present embodiment, as shown in FIG. 2B, the number of power supply contact pads (five pads) PW arranged in the region 16P1 is greater than that of power supply contact pads (two pads) PW arranged in the region 16L1. In FIG. 2B, the number of contact pads is counted so that the contact pads positioned on the center line C1 are not included in each of the regions 16P1 and 16L1.

With this arrangement, an average of the lengths of the power supply wiring lines 19PW, whose width is greater than that of the logic wiring line 19LG, arranged in the electrical wiring tape 23 can be less than that of the logic wiring lines 19LG. Accordingly, the reduction in the lengths of the arranged power supply wiring lines 19PW results in a reduction in wiring resistance. Thus, electric power can be efficiently supplied to the recording element substrate 12.

In addition, the number of power supply contact pads 16PW arranged in the region 16PP is greater than each of those in the other regions 16PL1, 16LP1, and 16LL. This arrangement is effective in reducing the average of the lengths of the arranged power supply wiring lines 19PW.

Since the width of each logic wiring line 19LG is less than a maximum width of each power supply wiring line 19PW, an area necessary to arrange the logic wiring lines 19LG is less than that necessary to arrange the power supply wiring lines 19PW.

When the area necessary to arrange the power supply wiring lines 19PW is reduced, therefore, the electrical wiring lines 19 can be efficiently arranged in the structure in which the width Wa of the first area is less than the width Wb of the second area. In addition, the electrical wiring tape 23 can be reduced in area.

The arrangement in the contact portion 16 in FIG. 2C will now be described. As shown in FIG. 2C, regions 16P2, 16L2, 16PP, 16PL2, 16LL, and 16LP2 are defined in a manner similar to FIG. 2B.

In the arrangement of FIG. 2C, the number of power supply contact pads (six pads) 16PW arranged in the region 16P2 is greater than that of power supply contact pads (one pad) 16PW disposed in the region 16L2 as in the case of the arrangement in FIG. 2B.

In addition, the number of power supply contact pads 16PW arranged in the region 16PP is greater than each of those in the other regions 16PL2, 16LP2, and 16LL.

Accordingly, the same advantages as those described with reference to FIG. 2B can be obtained in the arrangement of FIG. 2C.

The arrangement of lead terminals constituting the connection terminal portions 27 will now be described.

Referring to FIG. 2B, the electrical wiring tape 23 has the opening 20 in the first area, the opening 20 being used for attachment of the recording element substrate 12. The connection terminal portions 27 are arranged on both short sides of the opening 20 (i.e., in both ends thereof in the longitudinal direction). The center line (third center line) of the opening 20 in the direction Z is indicated by D.

As for the connection terminal portions 27, 27P2 indicates the connection terminal portion adjacent to the second area where the contact portion 16 is disposed with reference to the center line D in the direction Z and 27L2 denotes the other connection terminal portion remote from the second area.

In addition, lead terminals connected to the power supply wiring lines 19PW are termed "power supply lead terminals 27PW" and lead terminals connected to the logic wiring lines 19LG are termed "logic lead terminals 27LG".

In the present embodiment, the number of power supply lead terminals 27PW in the connection terminal portion 27P2 is greater than that in the other connection terminal portion 27L2.

With this arrangement, an average of the lengths of the power supply wiring lines 19PW arranged in the electrical wiring tape 23 can be less than that of the logic wiring lines 19LG. Thus, the electrical wiring tape 23 can be reduced in area.

In addition, the number of wide power supply wiring lines 19PW arranged up to the connection terminal portion 27L2 apart from the second area is less than that of power supply wiring lines 19PW arranged up to the connection terminal portion 27P2. Accordingly, even when a portion for arranging the wiring lines to the connection terminal portion 27L2 is small because the opening 20 is positioned in the first area, the electrical wiring lines 19 can be efficiently arranged as shown in the arrangement of FIG. 2B.

The arrangement of the connection terminal portions 27 in FIG. 2C will now be described.

Referring to FIG. 2C, the electrical wiring tape 23 has the opening 20 as in the case of the arrangement described with reference to FIG. 2B. The arrangement in FIG. 2C differs from that in FIG. 2B in that the lead terminals constituting the connection terminal portions 27 are arranged on both long sides of the opening 20.

The connection terminal portions 27P2 and 27L2 are defined in FIG. 2C in a manner similar to that in FIG. 2B.

In the arrangement in FIG. 2C, the number of power supply lead terminals 27PW in the connection terminal portion 27P2 is greater than that in the connection terminal portion 27L2 in a manner similar to the arrangement in FIG. 2B. Accordingly, the same advantages as those in the arrangement in FIG. 2B are obtained.

In the arrangement in FIG. 2C, since the connection terminal portions 27 are arranged on both of the long sides (extending in the direction Z) of the opening 20, the lead terminals can be arranged at a wider pitch than that in the arrangement of lead terminals on the short sides of the opening 20.

Accordingly, even when the number of lead terminals is increased, the width of the recording element substrate 12 can be prevented from increasing in the direction W.

In addition, since the pitch of the lead terminals can be increased, the area of bonding between each lead terminal and the corresponding electrode portion provided for the recording element substrate 12 can also be increased, thus raising the strength of bonding therebetween. Consequently, the electrical connection between the connection terminal portions 27 and the recording element substrate 12 can be increased in reliability.

In FIGS. 2A to 2C, the lateral direction of the opening positioned in the first area matches the direction W. The longitudinal direction of the opening may match the direction W. The shape of the opening may conform to that of the recording element substrate 12.

As shown in FIGS. 2A to 2C, the electrical wiring tape 23 has a tapered portion whose width extending in the direction W is gradually reduced from the second area where the contact portion 16 is positioned to the first area where the connection terminal portions 27 are arranged.

Since the electrical wiring tape 23 has the tapered portion as described above, the flexibility of arranging the electrical wiring lines 19 can be increased, thus preventing an increase in wiring resistance. In addition, the flexibility of arranging the contact pads can also be increased. Furthermore, since the tapered portion of the electrical wiring tape 23 is bent along the recording head 21 as shown in FIG. 2A, a force required to bend the tapered portion of the electrical wiring tape 23 can be less than that required to bend the second area thereof. Because the stiffness of the tapered portion whose width is less than that of the second area is also smaller than that of the second area.

The above-described arrangement in the present embodiment can provide a recording head which is reduced in manufacturing cost due to an increase in the number of electrical wiring tapes to be cut out and in which electric power can be efficiently supplied to a recording element substrate.

Figure 3A:
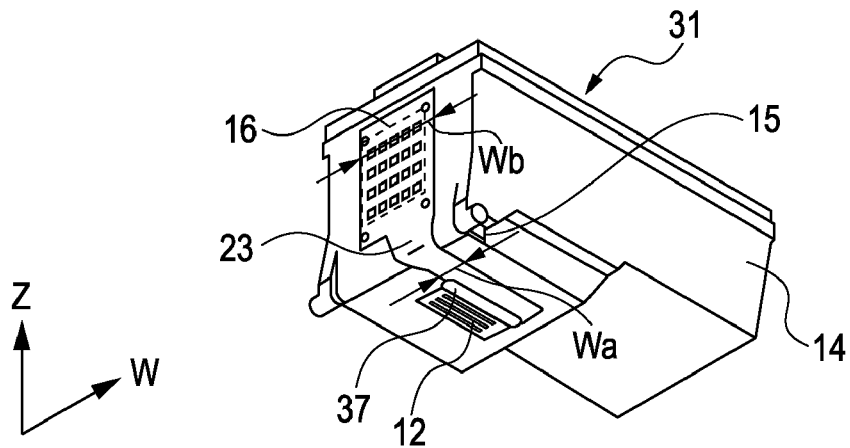
FIGS. 3A and 3B are diagrams explaining a third embodiment of the present invention.
Figure 3B:
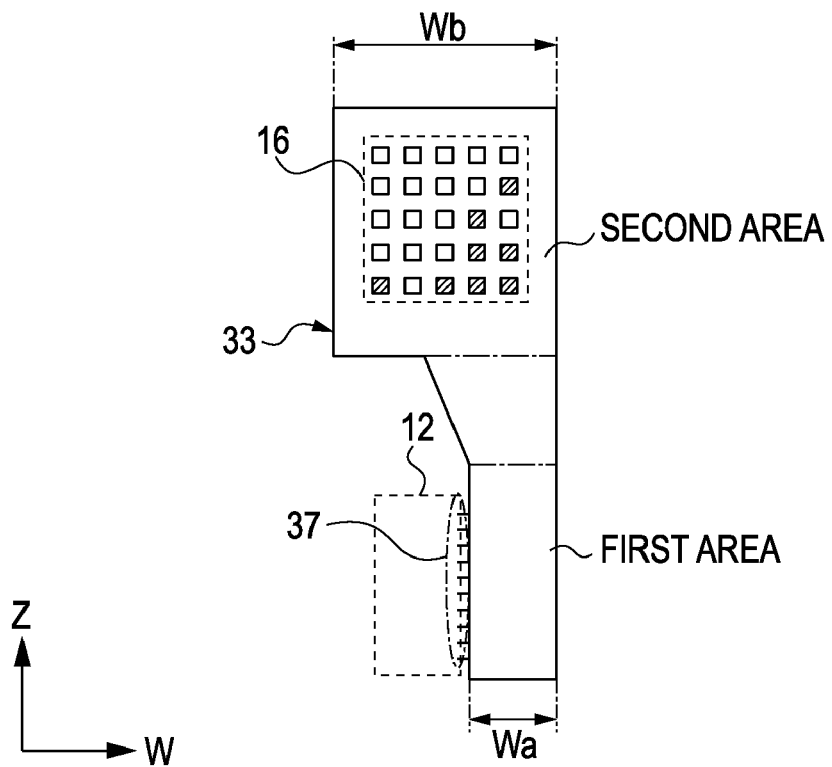
Figure 4A:
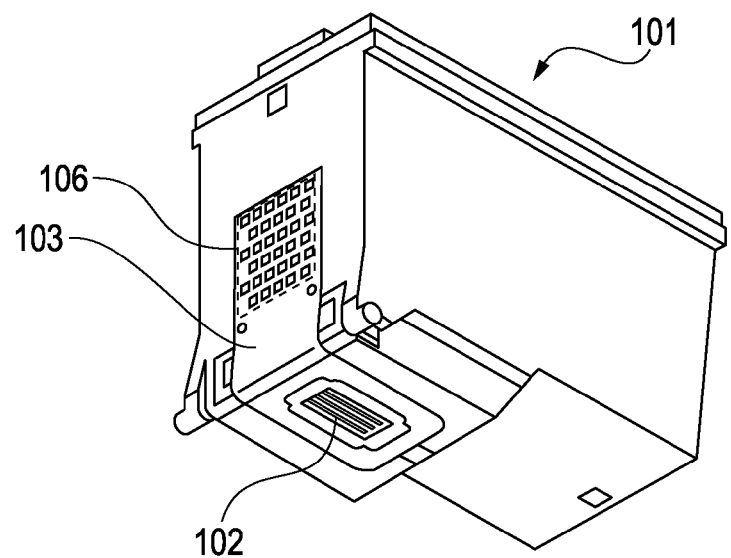
FIGS. 4A and 4B are diagrams explaining the structure of a conventional recording head.
Figure 4B:
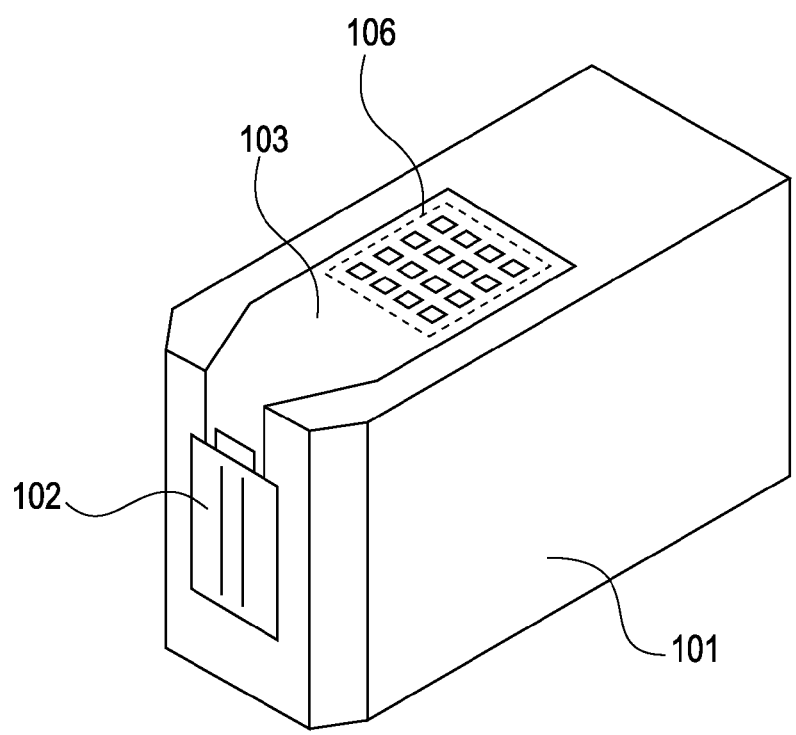

A third embodiment of the present invention will now be described. FIG. 3A illustrates a recording head 31 according to the present embodiment. FIG. 3B illustrates an electrical wiring tape 33 in the present embodiment. The entire structure of the recording head 31 is the same as that according to the first embodiment. Detailed explanation of components designated by the same reference numerals as those in the first embodiment is omitted.

The present embodiment differs from the first and second embodiments in the position of a connection terminal portion in the electrical wiring tape.

Referring to FIG. 3B, a connection terminal portion 37 is provided in one end extending the direction Z of a first area of the electrical wiring tape 33. With this arrangement, lead terminals can be arranged at a wide pitch in the same way as the second embodiment. Accordingly, even when the number of lead terminals is increased, the area of bonding between each lead terminal and a corresponding electrode portion provided for a recording element substrate 12 can be increased because the necessity of reducing the pitch of the lead terminals is small. This results in an increase in strength of bonding therebetween. Consequently, electrical connection between the connection terminal portion 37 and the recording element substrate 12 can be increased in reliability.

In the arrangement in accordance with the third embodiment, since the connection terminal portion 37 is connected to the one side of the recording element substrate 12, the width of the recording element substrate 12 in the direction W does not depend on the shape of the electrical wiring tape 33, particularly, the width Wa of a part, where the connection terminal portion 37 is provided, of the tape. Accordingly, a recording element substrate having a width in the direction W greater than the width Wa can be provided for the recording head. For example, when a plurality of discharge port arrays are provided for the recording element substrate, the width of the recording element substrate in the direction W is increased. When the arrangement in the present embodiment is applied to this case, it is effective.

The above-described arrangement in the present embodiment can provide a recording head whose manufacturing cost is reduced due to an increase in the number of electrical wiring tapes to be cut out and in which the width of a recording element substrate in the direction W does not depend on the width of a part, where a connection terminal portion is disposed, of the electrical wiring tape.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-276983 filed Oct. 28, 2008, which is hereby incorporated by reference herein in its entirety.

What is claimed is:

1. A flexible printed circuit board included in a liquid discharge head including a liquid discharge substrate for discharging liquid, the flexible printed circuit board comprising:
    a film whose length in the longitudinal direction is greater than the length in a direction orthogonal to the longitudinal direction;
    a plurality of connection terminals, arranged in a first area of the film adjacent to one side of the film in the longitudinal direction, for electrical connection to the liquid discharge substrate;
    a contact portion disposed in a second area of the film adjacent to the other side thereof in the longitudinal direction, the contact portion including a plurality of contact pads for electrical connection to the outside; and
    a plurality of wiring lines, arranged in the film, for electrical connection between the connection terminals and the contact pads,
    wherein the length of the second area of the film in the direction orthogonal to the longitudinal direction is more than two times the length of the first area thereof in that direction, and
    wherein one end of the first area in the direction orthogonal to the longitudinal direction and one end of the second area in that direction are in line with each other in the longitudinal direction.

2. The flexible printed circuit board according to claim 1, wherein a part of the flexible printed circuit board is bent, the part having a width smaller than that of the second area.

3. The flexible printed circuit board according to claim 1, wherein the connection terminals are arranged in one end of the first area.

4. The flexible printed circuit board according to claim 3, wherein the connection terminals are arranged in the direction orthogonal to the longitudinal direction.

5. The flexible printed circuit board according to claim 3, wherein the connection terminals are arranged in the longitudinal direction.

6. The flexible printed circuit board according to claim 1, wherein
    the wiring lines include first wiring lines and second wiring lines each having a width less than a maximum width of the first wiring line, and
    the number of contact pads, connected to the first wiring lines, arranged in a region of the contact portion adjacent to the first area relative to a first center line of the contact portion in the direction orthogonal to the longitudinal direction is greater than that in a region of the contact portion remote from the first area relative to the first center line.

7. A liquid discharge head including a liquid discharge substrate for discharging liquid, the head comprising the flexible printed circuit board according to claim 6.

8. The liquid discharge head according to claim 7, wherein
    the liquid discharge substrate includes an energy generating element for discharging the liquid, and
    the first wiring lines include a wiring line for supplying electric power used for driving the energy generating element to the liquid discharge substrate.

9. The flexible printed circuit board according to claim 1, wherein
    the wiring lines include first wiring lines and second wiring lines each having a width less than a maximum width of the first wiring line, and
    the number of contact pads, connected to the first wiring lines, in a region of the contact portion adjacent to the first area relative to a second center line of the contact portion in the longitudinal direction is greater than that in a region of the contact portion remote from the first area relative to the second center line.

10. The flexible printed circuit board according to claim 1, wherein an opening for receiving the liquid discharge substrate is provided in the first area such that the connection terminals are arranged in the periphery of the opening, the wiring lines include first wiring lines and second wiring lines each having a width less than a maximum width of the first wiring line, and the number of connection terminals, connected to the first wiring lines, arranged in a region of the opening adjacent to the second area relative to a third center line of the opening in the longitudinal direction is greater than that in a region of the opening remote from the second area relative to the third center line.

11. A liquid discharge head including a liquid discharge substrate for discharging liquid, the head comprising the flexible printed circuit board according to claim 1.

12. The liquid discharge head according to claim 7, wherein the liquid discharge substrate includes an energy generating element for discharging the liquid, and the second wiring lines include a wiring line for supplying a signal used for controlling the driving of the energy generating element.

13. A flexible printed circuit board included in a liquid discharge head including a liquid discharge substrate for discharging liquid, the flexible printed circuit board comprising:

a film whose length in the longitudinal direction is greater than the length in a direction orthogonal to the longitudinal direction;

a plurality of connection terminals, arranged in a first area of the film adjacent to one side of the film in the longitudinal direction, for electrical connection to the liquid discharge substrate;

a contact portion disposed in a second area of the film adjacent to the other side thereof in the longitudinal direction, the contact portion including a plurality of contact pads for electrical connection to the outside; and a plurality of wiring lines, arranged in the film, for electrical connection between the connection terminals and the contact pads, wherein the length of the second area of the film in the direction orthogonal to the longitudinal direction is more than two times the length of the first area thereof in that direction, and wherein the planar shape of the film is L-shaped.

\* \* \* \* \*